(12) United States Patent
Hardy

(10) Patent No.: US 9,766,314 B2
(45) Date of Patent: Sep. 19, 2017

(54) SYSTEMS AND METHODS FOR DESIGN OF MAGNETIC RESONANCE IMAGING SLICE-SELECT PULSES

(71) Applicant: General Electric Company, Schenectady, NY (US)

(72) Inventor: Christopher Judson Hardy, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 822 days.

(21) Appl. No.: 14/257,713

(22) Filed: Apr. 21, 2014

(65) Prior Publication Data

US 2015/0301131 A1   Oct. 22, 2015

(51) Int. Cl.
*G01R 33/28* (2006.01)
*G01R 33/56* (2006.01)
*G01R 33/561* (2006.01)
*G01R 33/36* (2006.01)
*G01R 33/483* (2006.01)

(52) U.S. Cl.
CPC ............................... *G01R 33/4833* (2013.01)

(58) Field of Classification Search
CPC .............. G01R 33/4833; G01R 33/483; G01R 33/4835; G01R 33/54; G01R 33/288; G01R 33/3607; G01R 33/56; G01R 33/561
USPC ................................................. 324/307, 309
See application file for complete search history.

(56) References Cited

U.S. PATENT DOCUMENTS

| 2008/0284439 A1* | 11/2008 | Xu | A61B 5/055 |
| | | | 324/322 |
| 2014/0232396 A1* | 8/2014 | Grodzki | G01R 33/543 |
| | | | 324/309 |
| 2015/0032406 A1* | 1/2015 | Grodzki | G01R 33/5608 |
| | | | 702/123 |

* cited by examiner

*Primary Examiner* — Melissa Koval
*Assistant Examiner* — Rishi Patel
(74) *Attorney, Agent, or Firm* — Pabitra K. Chakrabarti

(57) ABSTRACT

A system, non-transitory computer-readable medium, and method of designing quiet variable-rate MRI slice-select pulses includes creating discretized first slice-select constant-amplitude gradient and RF waveforms, associating discretized time points having a first constant time increment with the first waveforms, selecting a scaling function that smooths the gradient waveform when multiplied together, multiplying the gradient and RF waveforms by the corresponding value of the scaling function to create second gradient and RF waveforms, dividing the time increment between the discretized time points by the corresponding value of the scaling function to create a remapped time increment, cumulatively summing the remapped time increments to create a remapped time scale, interpolating the second gradient and RF waveforms along the remapped time scale to form final gradient and RF waveforms, and providing the final gradient and RF waveforms for incorporation into an MRI pulse sequence.

18 Claims, 5 Drawing Sheets

SYSTEMS AND METHODS FOR DESIGN OF MAGNETIC RESONANCE IMAGING SLICE-SELECT PULSES

BACKGROUND

Variable-rate selective excitation (VERSE) is a pulse reshaping technique that is applied to the RF and gradient slice-select waveforms used in magnetic resonance imaging (MRI) to reduce the RF power of the slice-select pulses. VERSE allows for a variable trade-off between RF and gradient amplitudes and sample duration for each time sample of the pulse. This results in an RF waveform whose peak region is truncated in amplitude and stretched in time, while the corresponding portions of the gradient waveform experience a dip. This reshaping produces a reduction in peak magnitude and specific absorption rate (SAR) of the RF pulses while preserving MR excitation profiles on-resonance.

In some applications, a VERSE algorithm has been applied to multidimensional and parallel-transmit selective excitation pulses, reshaping the RF and gradient waveforms to take advantage of available gradient amplitude and slew rate, to produce the shortest pulse possible without changing the two-dimensional excitation profile. This results in, e.g., two-dimensional selective excitation pulses with optimal bandwidth, and identical two-dimensional excitation profiles to the original pulses on-resonance.

Slice-select pulses can be made quieter by de-rating them—i.e., by reducing gradient slew rate and/or amplitude (along with RF bandwidth), but both of these measures produce longer pulses and thus increase minimum echo time. Other approaches smooth the corners of various gradient waveforms to make them quieter. For instance, gradient crushers around RF refocusing pulses can be smoothed and lengthened while modifying readout bandwidth in fast spin echo sequences. However, these approaches do not change gradients that are played out during an RF pulse, and are not applicable during RF excitation, inversion, or refocusing pulses.

The pulsing of gradients in MRI pulse sequences can be loud, leading to patient discomfort and impaired communication with scan operators. There are pulse sequences that reduce the acoustic noise. Because of difficulty in quieting the slice-select pulse, these sequences are generally volumetric sequences. While slice select gradient pulses can be de-rated to reduce loudness, a longer minimum echo time can be required, and sometimes a narrower pulse bandwidth is also necessary.

DETAILED DESCRIPTION

In accordance with embodiments, a variable-rate principle is employed to design slice-select pulses with improved acoustic signatures while maintaining identical on-resonance slice profiles. RF and gradient waveforms are scaled down together during the beginning and end of the pulse (with time increments broadened proportionately), and scaled up in the middle of the pulse (with time increments narrowed proportionately). The result is a quieter slice-select pulse with rounder gradient corners, and an unchanged slice profile for on-resonance spins.

In accordance with implementations using this variable-rate design, the RF and gradient waveforms are reshaped together in such a way that the magnetization vector on-resonance follows the same trajectory (but at varying rates) over the course of the excitation, resulting in an identical slice profile for on-resonance spins.

Figure 1:
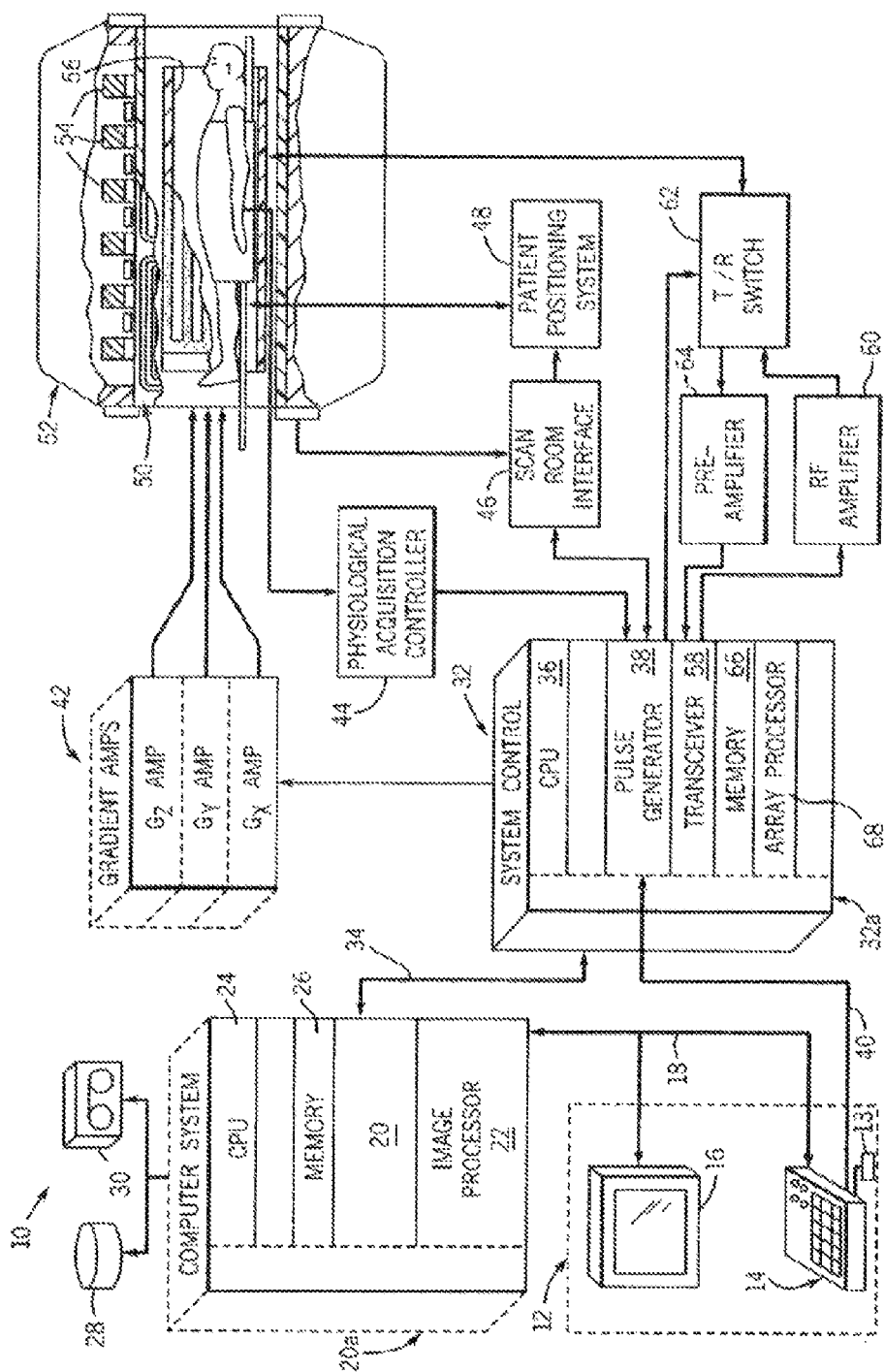
FIG. 1 depicts an MRI system in accordance with some embodiments.

FIG. 1 depicts components of MRI system 10 in accordance with some embodiments. System 10 can be controlled from operator console 12, which can include a keyboard or other input device 13, a control panel 14, and a display 16. Console 12 communicates through communication network 18 with a computer system 20. Computer system 20 can include computer executable instructions that when executed enable an operator to control the production and display of images on screen 16. Computer system 20 can include a number of modules which communicate with each other through a backplane 20a. These modules can include image processor module 22, control processor unit (CPU) 24, and memory module 26, known in the art as a frame buffer for storing image data arrays. The computer system 20 is linked to disk storage 28 and tape drive 30 for storage of image data and programs (i.e., computer executable instructions). The computer system can communicate MRI imaging system control 32 through network 18 and/or high speed serial link 34. Input device 13 can include a mouse, joystick, keyboard, track ball, touch screen, light wand, voice control, or similar device, and may be used for interactive geometry prescription.

MRI imaging system control 32 can include a set of modules connected together by backplane 32a. These modules can include control processor unit (CPU) 36 and pulse generator module 38 which connects to the operator console through serial link 40. System control 32 receives commands through serial link 40 from the operator. These commands can indicate, for example, the scan sequence that is to be performed. Pulse generator module 38 operates the system components to carry out the desired scan sequence and produces data which indicates the timing, strength and shape of the RF pulses produced, and the timing and length of the data acquisition window. The pulse generator module connects to a set of gradient amplifiers 42, to indicate the timing and shape of the gradient pulses that are produced during the scan. Pulse generator module 38 also receives patient data from physiological acquisition controller 44 that receives signals from a number of different sensors connected to the patient, such as ECG signals from electrodes attached to the patient. Further, pulse generator module 38 connects to a scan room interface circuit 46 which receives signals from various sensors associated with the condition of the patient and the magnet system. It is also through scan room interface circuit 46 that a patient positioning system 48 receives commands to move the patient to the desired position for the scan.

The gradient waveforms produced by the pulse generator module 38 are applied to gradient amplifier system 42 having Gx, Gy, and Gz, amplifiers. Each gradient amplifier excites a corresponding physical gradient coil in an assembly generally designated 50 to produce the magnetic field gradients used for spatially encoding acquired signals. Gradient coil assembly 50 forms part of magnet assembly 52 which includes polarizing magnet 54 and whole-body RF coil 56. Transceiver module 58 in system control 32 produces pulses which are amplified by RF amplifier 60 and coupled to RF coil 56 by transmit/receive switch 62. The resulting signals emitted by the excited nuclei in the patient may be sensed by the same RF coil and coupled through the transmit/receive switch to preamplifier 64. The amplified MR signals are demodulated, filtered, and digitized in the receiver section of transceiver 58. The transmit/receive switch is controlled by a signal from pulse generator module 38 to electrically connect RF amplifier 60 to coil 56 during the transmit mode and to connect preamplifier 64 during the receive mode. The transmit/receive switch also enables a separate RF coil (for example, a surface coil) to be used in either transmit or receive mode.

The MR signals picked up by the RF coil 56 are digitized by the transceiver module 58 and transferred to memory module 66 in the system control 32. This raw k-space data can be rearranged into separate k-space data arrays for each image to be reconstructed, and each of these is input to array processor 68 which can execute instructions to perform the embodying methods described herein. The image data can be conveyed through the serial link to computer system 20 where it is stored in disk memory 28. In response to commands received from operator console 12, image data may be archived on tape drive 30, or it may be further processed by image processor 22 and presented on display 16.

Embodying systems and methods are suitable for use with the above-referenced MR system, or any similar or equivalent system for obtaining MR images.

In accordance with some embodiments, quieter slice-select pulses with rounder gradient corners, and an unchanged slice profile for on-resonance spins is designed by scaling down both RF and gradient waveforms during the beginning and end of the pulse (with time increments broadened proportionately), and scaling up in the middle of the pulse (with time increments narrowed proportionately). In accordance with an implementation, a subsequent slice-select gradient refocusing lobe, which is not simultaneous with any RF pulse, can be independently reshaped.

Figure 2:
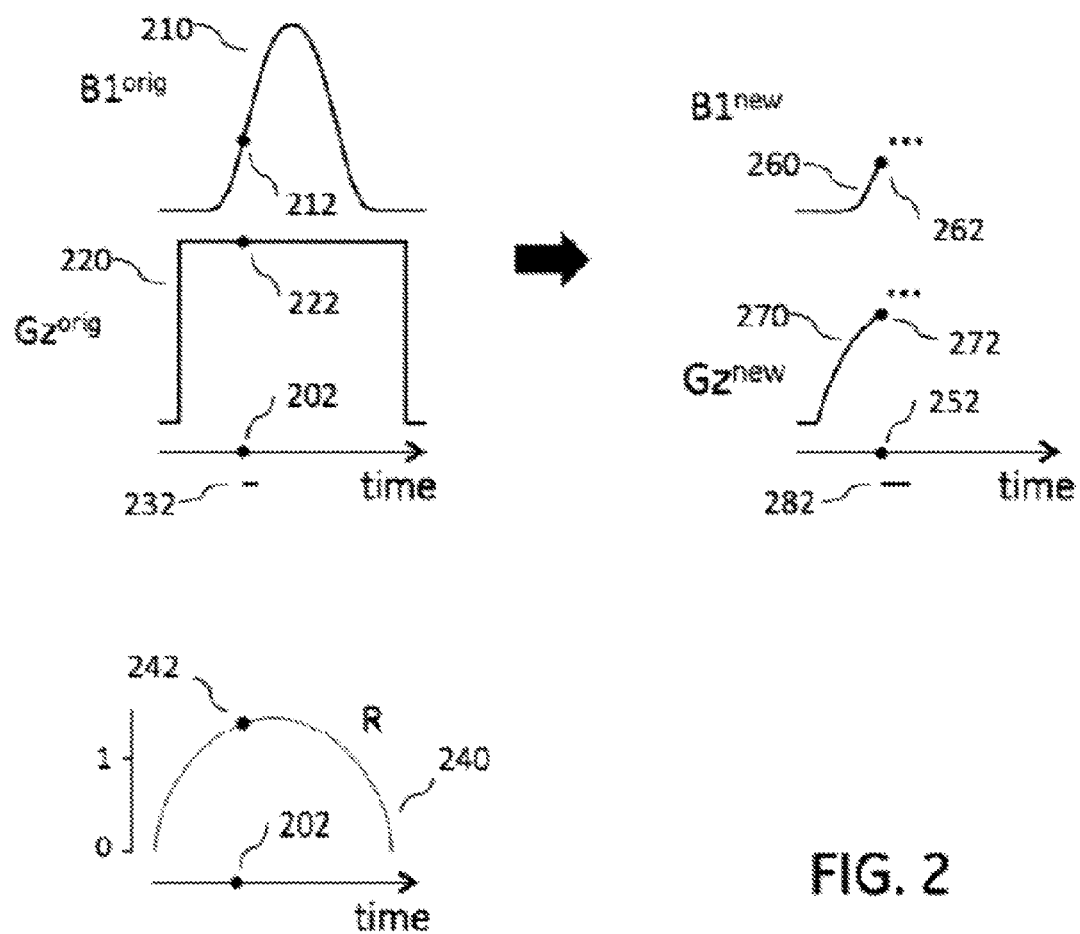
FIG. 2 schematically depicts an RF signal and gradient signals in accordance with some embodiments.

FIG. 2 schematically depicts original RF waveform 210 and original gradient waveform 220 in accordance with some embodiments. In accordance with one implementation, the scaling of waveforms is achieved by selecting scaling function R 240 that varies in time over the course of the pulse.

RF waveform 210 and gradient waveform 220 are discretized into time increments i, where i ranges from 1 to N points. For point i 202, the RF waveform has an amplitude $B1^{orig}_i$ 212, the gradient waveform has amplitude $Gz^{orig}_i$ 222, and the time increment $dt^{orig}_i$ 232 is equal to T/(N−1), where T is the length in time of the waveforms 210 and 220. For each point i, a scaling factor $R_i$ 242 is chosen, where the scaling factor varies with i in such a way as to round off the corners of gradient waveform 220 to reduce acoustic noise. For example, the scaling factor may be proportional to the square root of a half-cycle sine:

$$R_i = 1.4 * \text{sqrt}(\sin(\theta_i)) \quad \text{(EQ. 1)}$$

where $\theta_i = ((i-1)/(N-1))*\pi$.

For each time increment i 202, the scaling factor $R_i$ 242 is used to scale $B1^{orig}_i$ 212 to create a new RF amplitude $B1^{new}_i$ 262. $R_i$ also scales $Gz^{orig}_i$ 222 to create a new gradient amplitude $Gz^{new}_i$ 272; and inversely scale time increment $dt^{orig}_i$ 232 to create a new time increment $dt^{new}_i$ 282. New RF amplitude can be expressed as:

$$B1^{new}_i = R_i * B1^{orig}_i \quad \text{(EQ. 2)}$$

$$Gz^{new}_i = R_i * Gz^{orig}_i \quad \text{(EQ. 3)}$$

$$dt^{new}_i = dt^{orig}_i / R_i \quad \text{(EQ. 4)}$$

The new waveform amplitudes $B1^{new}_i$, $Gz^{new}_i$, and corresponding time increments $dt^{new}_i$ are calculated for all points i between 1 and N. The time $t^{new}_i$ for point i is the cumulative sum of all $dt^{new}_i$ for all preceding points. Because the time increments $dt^{new}_i$ vary in width for each value of i, the waveforms must then be interpolated onto a new grid having constant time increments, using a reasonable number of points. This results in final remapped waveforms $B1^{rem}$ and $Gz^{rem}$, which can be stored as external waveforms to be imported by the MR pulse sequence.

Curve 240 is a plot of scaling function R over time, where when the function is greater than one the waveform amplitudes are increased and their timing is compressed; and when the function is less than 1 the waveform amplitudes are decreased and their timing is stretched. As illustrated by scaling-function curve 240, both the RF and gradient waveforms are scaled down during the beginning and end of the pulse (with time increments broadened proportionately), and scaled up in the middle of the pulse (with time increments narrowed proportionately). In some embodiments the average value of $R_i$, for i from 1 to N, is 1.

Figure 3:
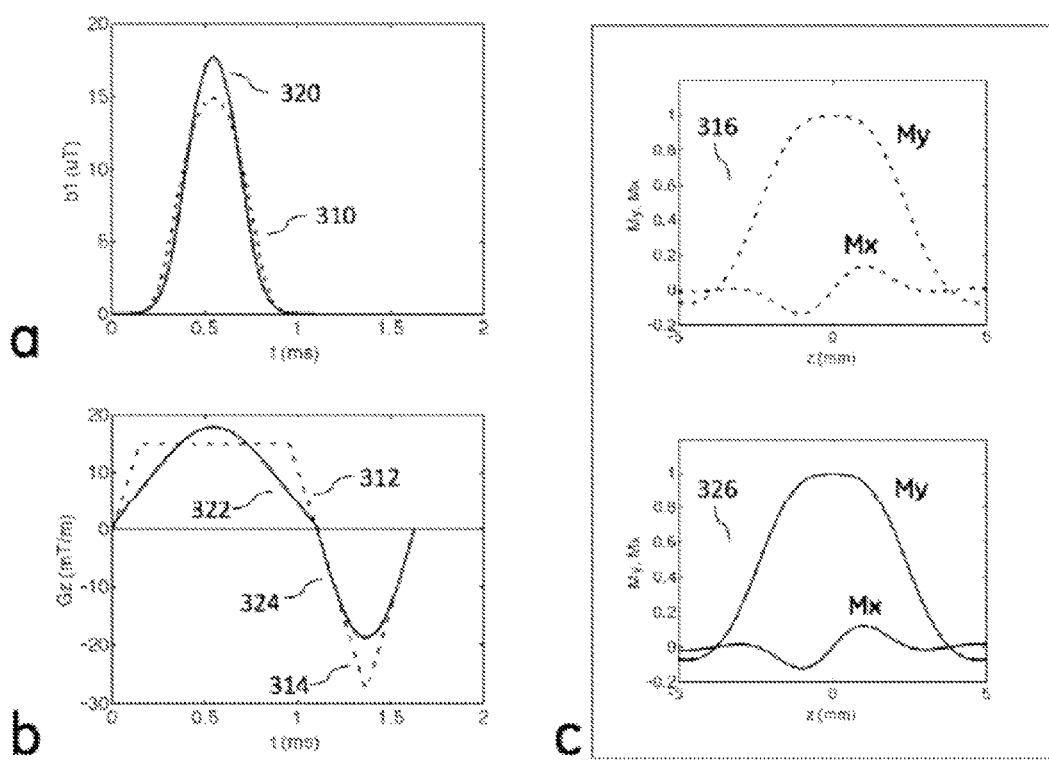
FIG. 3 depicts a quiet slice-select pulse designed in accordance with some embodiments.

FIG. 3 depicts a quiet slice-select pulse designed in accordance with some embodiments, using a scaling factor R that is the square root of a half-cycle sine. Waveforms 310 and 312 are conventional RF and gradient slice-select waveforms, respectively. Waveform 314 is a conventional gradient refocusing lobe. The amplitude of waveform 314 has been chosen so that the area under waveform 314 is the negative of one half the area under waveform 312, to insure that the phase of the magnetization is essentially constant across the slice profile.

Waveforms 320 and 322 show the remapped RF and gradient waveforms, respectively for the quiet slice-select pulse. Waveform 324 is a gradient refocusing waveform reshaped using conventional methods. Its shape is a half-cycle sine, and its amplitude was chosen so that the area under waveform 324 is the negative of one half the area under waveform 322. Note that since the area under waveform 322 is slightly less than the area under waveform 312, waveform 324 has a correspondingly smaller area than waveform 314.

Slice profiles corresponding to these pulses were calculated using a Bloch simulator, for on-resonance spins. Slice profile 316 corresponds to the conventional slice-select pulse comprising components 310, 312, and 314. Slice profile 326 corresponds to the remapped quiet slice-select pulse comprising components 320, 322, and 324. The slice profiles 316, 326 are essentially indistinguishable. The slice-select pulse sequences were played out on a commercial 3T MRI scanner with a repetition time of 34 msec, and sound levels were recorded using a microphone placed in the scanner bore. An overall reduction in sound levels of roughly 7 dBA was recorded for the quiet pulse relative to the conventional pulse. Furthermore, as is evident by the conventional and quiet slice-select waveforms as presented in FIG. 3, the improvements provided by the embodying variable-rate approach are achieved without increasing the pulse length.

Figure 4:
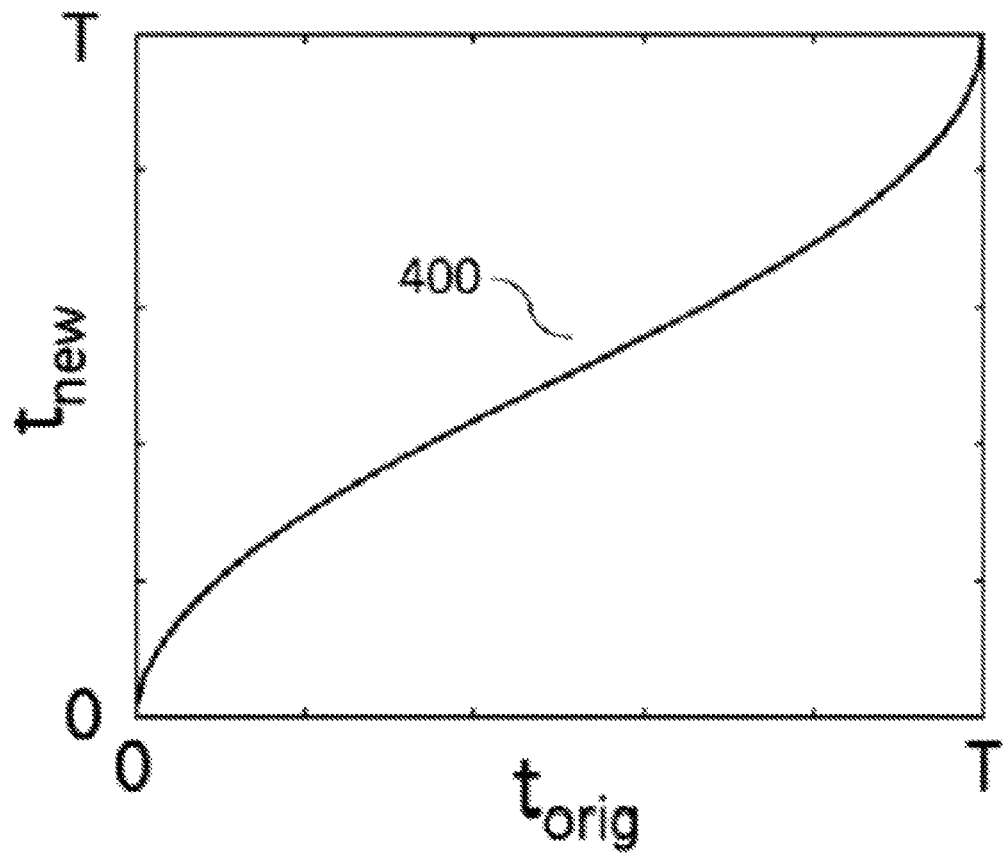
FIG. 4 depicts a variable-rate pulse schedule in accordance with some embodiments.

FIG. 4 depicts the variable-rate pulse schedule 400 for the embodying variable-rate slice-select pulse approach depicted by the solid curves 320, 322. Pulse schedule 400 was determined by calculating $t^{new}_i$ from $dt^{new}_i$, derived from a scaling function R that was proportional to the square root of a half-cycle sine. Both conventional pulses and quiet variable-rate pulses had identical slice profiles on-resonance. For the variable-rate excitation, the peaks of the RF pulse, slice-select gradient lobe, and refocusing lobe had relative amplitudes of about 1.19, 1.19, and 0.68, respectively compared to the standard pulse. Compared to the standard pulse, the variable-rate pulse had overall relative sound levels of about −7 dBA.

In accordance with one implementation, at 300 Hz off-resonance, the variable-rate pulse experienced a similar average spatial shift to the standard pulse, but with a broadening of the slice profile by about 12%. Use of variable-rate slice-selective excitation pulses can provide added acoustic benefits beyond conventional reshaping and smoothing of gradient pulses such as phase-encodes, crushers, spoilers, and rewinders, although with potentially higher RF power than conventional slice-select pulses. Variable-rate remapping to produce quieter slice-select pulses is not limited to excitation pulses—application to slice-selective inversion pulses and slice-selective refocusing pulses is also available. Pulse reshaping can also be done by pulse scaling functions R other than the exemplary square root of a half-cycle sine.

Sound level measurements indicate that in one implementation, acoustic noise levels can be reduced by about 7 dB relative to standard slice-select pulses, without any increase in minimum echo time. This reduction can be achieved without any modifications to scanner hardware components and modules. Overall reduction in loudness achieved is a function of the full pulse sequence, including readout, phase-encode, crushers, etc.

Figure 5:
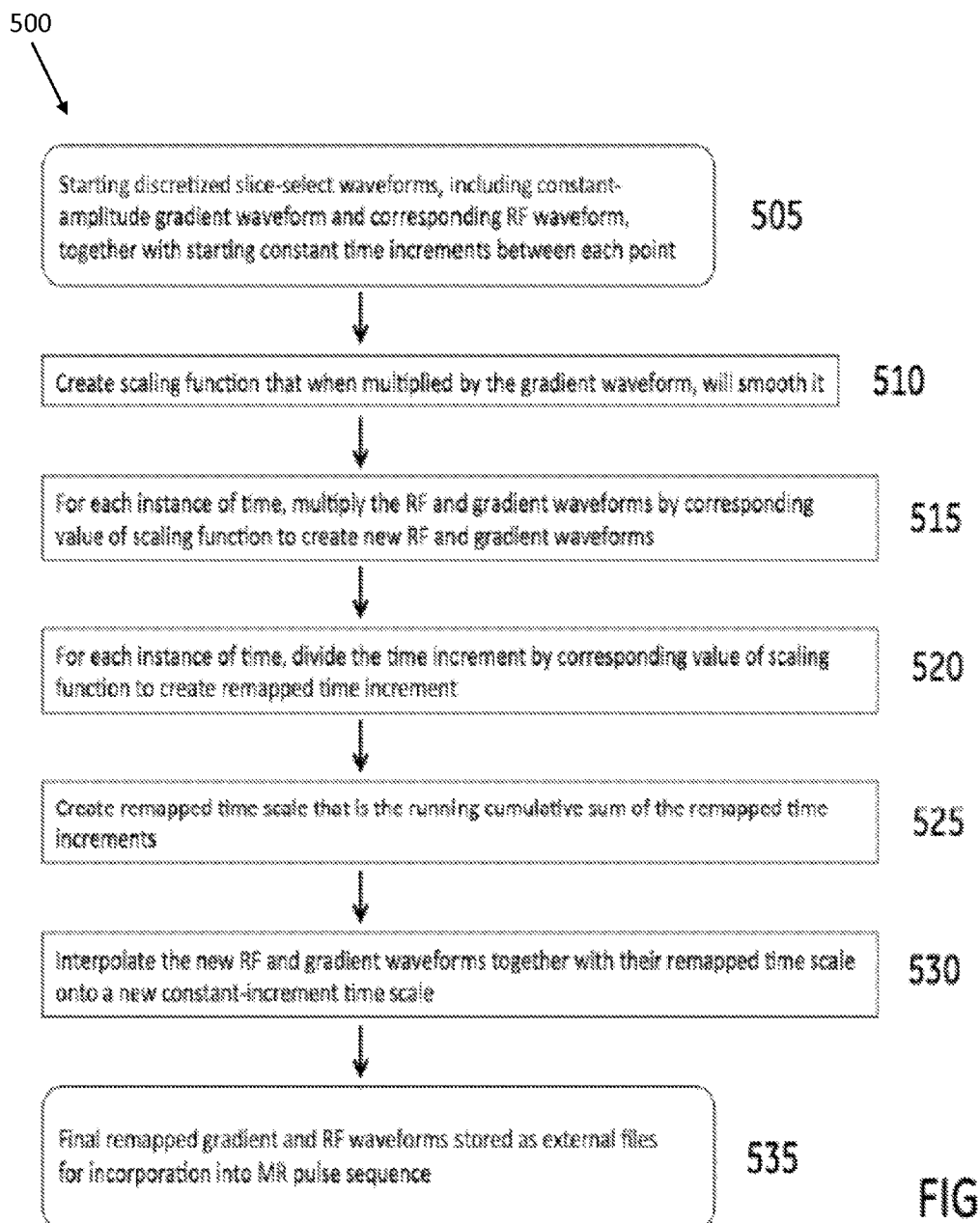
FIG. 5 depicts a variable-rate process for designing quiet slice-select pulses in accordance with some embodiments.

FIG. 5 depicts process 500 for creating variable-rate slice-select pulses for use in an MRI system in accordance with some embodiments. In step 505, starting discretized slice-select waveforms are created, including a constant-amplitude gradient waveform and a corresponding RF waveform, together with starting constant time increments between each point. In step 510, a scaling function is created. The gradient waveform can be smoothed by multiplying it by the scaling function. In step 515, for each instance of time the RF and gradient waveforms are multiplied by the corresponding value of the scaling function to create new RF and gradient waveforms. In step 520, for each instance of time, the time increment is divided by the corresponding value of the scaling function to create a remapped time increment.

In step 525, a remapped time scale is created that is the running cumulative sum of the remapped time increments. In step 530, the new RF and gradient waveforms together with their remapped time scale are interpolated onto a new constant-increment time scale. In step 535, the final remapped gradient and RF waveforms are stored as external files for incorporation into the MR pulse sequence.

In accordance with some embodiments, a computer program application stored in non-volatile memory or computer-readable medium (e.g., register memory, processor cache, RAM, ROM, hard drive, flash memory, CD ROM, magnetic media, etc.) may include code or executable instructions that when executed may instruct and/or cause a controller or processor to perform methods discussed herein such as a method for designing slice-select pulses using a variable-rate to obtain improved acoustic signatures in MRI measurements while maintaining identical on-resonance slice profiles, as described above.

The computer-readable medium may be a non-transitory computer-readable media including all forms and types of memory and all computer-readable media except for a transitory, propagating signal. In one implementation, the non-volatile memory or computer-readable medium may be external memory.

Although specific hardware and methods have been described herein, note that any number of other configurations may be provided in accordance with embodiments of the invention. Thus, while there have been shown, described, and pointed out fundamental novel features of the invention, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:

1. A method of variable-rate design of quiet magnetic resonance imaging slice-selective excitation, inversion, or refocusing pulses, the method comprising:
creating discretized first slice-select waveforms, the slice-select waveforms including constant-amplitude gradient waveform and corresponding radio frequency (RF) waveform;
associating a plurality of discretized time points with the discretized first waveforms, each of the plurality of discretized time points having a first time increment that is constant;
selecting a scaling function, the scaling function smoothing the gradient waveform when multiplied together;
for each of the plurality of discretized time points, multiplying the gradient waveform and the RF waveform by the corresponding value of the scaling function so as to create second gradient waveform and second RF waveform;
dividing the time increment between each of the plurality of discretized time points by the corresponding value of the scaling function to create a remapped time increment between each of the plurality of discretized time points;
cumulatively summing the remapped time increments to create a remapped time scale;
interpolating the second gradient waveform and the second RF waveform along the remapped time scale to form a final remapped gradient waveform and a final remapped RF waveform; and
providing the final gradient waveform and the final RF waveform for incorporation into a magnetic resonance pulse sequence.

2. The method of claim 1, including selecting a waveform scaling function that varies in time over a pulse period.

3. The method of claim 1, including:
scaling down a pulse amplitude of the RF waveform and the gradient waveform during a beginning of the pulse waveforms;
scaling up the pulse amplitude of the RF waveform and the gradient waveform at a middle of the pulse; and
scaling down the pulse amplitude of the RF waveform and the gradient waveform at an end of the pulse.

4. The method of claim 1, including independently reshaping a subsequent slice-select gradient refocusing lobe, where the subsequent slice-select gradient refocusing lobe is not simultaneous with any RF pulse.

5. The method of claim 1, wherein the providing step includes storing in memory the final gradient waveform and the final RF waveform.

6. The method of claim 1, including varying the scaling function over the plurality of discretized time points so that pulse corners of the gradient waveform are rounded off.

7. A non-transitory computer-readable medium having stored thereon instructions which when executed by a processor cause the processor to perform a method of variable-rate design of quiet magnetic resonance imaging slice-selective excitation, inversion, or refocusing pulses, the method comprising:
creating discretized first slice-select waveforms, the slice-select waveforms including constant-amplitude gradient waveform and corresponding radio frequency (RF) waveform;
associating a plurality of discretized time points with the discretized first waveforms, each of the plurality of discretized time points having a first time increment that is constant;
selecting a scaling function, the scaling function smoothing the gradient waveform when multiplied together;
for each of the plurality of discretized time points, multiplying the gradient waveform and the RF waveform by the corresponding value of the scaling function so as to create second gradient waveform and second RF waveform;
dividing the time increment between each of the plurality of discretized time points by the corresponding value of the scaling function to create a remapped time increment between each of the plurality of discretized time points;
cumulatively summing the remapped time increments to create a remapped time scale;
interpolating the second gradient waveform and the second RF waveform along the remapped time scale to form a final remapped gradient waveform and a final remapped RF waveform; and
providing the final gradient waveform and the final RF waveform for incorporation into a magnetic resonance pulse sequence.

8. The medium of claim 7, including instructions to cause the processor to perform the step of selecting a waveform scaling function that varies in time over a pulse period.

9. The medium of claim 7, including instructions to cause the processor to perform the steps of:
scaling down a pulse amplitude of the RF waveform and the gradient waveform during a beginning of the pulse waveforms;
scaling up the pulse amplitude of the RF waveform and the gradient waveform at a middle of the pulse; and
scaling down the pulse amplitude of the RF waveform and the gradient waveform at an end of the pulse.

10. The medium of claim 7, including instructions to cause the processor to perform the step of independently reshaping a subsequent slice-select gradient refocusing lobe, where the subsequent slice-select gradient refocusing lobe is not simultaneous with any RF pulse.

11. The medium of claim 7, including instructions to cause the processor to perform the performing step by storing in memory the final gradient waveform and the final RF waveform.

12. The medium of claim 7, including instructions to cause the processor to perform the step of varying the scaling function over the plurality of discretized time points so that pulse corners of the gradient waveform are rounded off.

13. A system for variable-rate design of quiet magnetic resonance imaging slice-selective excitation, inversion, or refocusing pulses, the system comprising:
a magnetic resonance imaging system including a control processor, gradient amplifiers, a radio frequency amplifier, and a pulse generator, wherein the control processor is in communication with the gradient amplifiers, the radio frequency amplifier, and the pulse generator;
the control processor configured to execute computer-readable instructions that cause the control processor to perform a method including:
creating discretized first slice-select waveforms, the slice-select waveforms including constant-amplitude gradient waveform and corresponding radio frequency (RF) waveform;
associating a plurality of discretized time points with the discretized first waveforms, each of the plurality of discretized time points having a first time increment that is constant;
selecting a scaling function, the scaling function smoothing the gradient waveform when multiplied together;
for each of the plurality of discretized time points, multiplying the gradient waveform and the RF waveform by the corresponding value of the scaling function so as to create second gradient waveform and second RF waveform;
dividing the time increment between each of the plurality of discretized time points by the corresponding value of the scaling function to create a remapped time increment between each of the plurality of discretized time points;
cumulatively summing the remapped time increments to create a remapped time scale;
interpolating the second gradient waveform and the second RF waveform along the remapped time scale to form a final remapped gradient waveform and a final remapped RF waveform; and
providing the final gradient waveform and the final RF waveform for incorporation into a magnetic resonance pulse sequence.

14. The system of claim 13, including instructions to cause the processor to perform the step of selecting a waveform scaling function that varies in time over a pulse period.

15. The system of claim 13, including instructions to cause the processor to perform the steps of:
scaling down a pulse amplitude of the RF waveform and the gradient waveform during a beginning of the pulse waveforms;
scaling up the pulse amplitude of the RF waveform and the gradient waveform at a middle of the pulse; and
scaling down the pulse amplitude of the RF waveform and the gradient waveform at an end of the pulse.

16. The system of claim 13, including instructions to cause the processor to perform the step of independently reshaping a subsequent slice-select gradient refocusing lobe, where the subsequent slice-select gradient refocusing lobe is not simultaneous with any RF pulse.

17. The system of claim 13, including instructions to cause the processor to perform the performing step by storing in memory the final gradient waveform and the final RF waveform.

18. The system of claim 13, including instructions to cause the processor to perform the step of varying the scaling function over the plurality of discretized time points so that pulse corners of the gradient waveform are rounded off.

* * * * *